United States Patent [19]

Bullock et al.

[11] Patent Number: 4,788,652
[45] Date of Patent: Nov. 29, 1988

[54] I-Q CHANNEL ADAPTIVE LINE ENHANCER

[75] Inventors: Scott R. Bullock, West Jordan; Patrick J. Smith, Salt Lake City, both of Utah; Laurence D. Sawyer, Reading, Vt.

[73] Assignee: Unisys Corporation, Blue Bell, Pa.

[21] Appl. No.: 30,303

[22] Filed: Mar. 26, 1987

[51] Int. Cl.$^4$ ............................ G06J 1/00; H04B 3/14
[52] U.S. Cl. .................................... 364/602; 333/166; 333/18; 364/825; 375/14; 375/15
[58] Field of Search ............... 364/602, 604, 825, 724; 333/165, 166, 167, 174, 18, 28 R; 375/11, 12, 14–16

[56] References Cited

U.S. PATENT DOCUMENTS

| | | | |
|---|---|---|---|
| 4,225,832 | 9/1980 | Faye | 364/825 X |
| 4,236,224 | 11/1980 | Chang | 364/724 |
| 4,238,746 | 12/1980 | McCool et al. | 333/166 |
| 4,243,935 | 1/1981 | McCool et al. | 324/77 R |
| 4,351,060 | 9/1982 | Treiber | 364/724 X |
| 4,635,276 | 1/1987 | Karabinis | 375/15 |
| 4,726,035 | 2/1988 | Bullock et al. | 364/825 X |

Primary Examiner—Joseph Ruggiero
Attorney, Agent, or Firm—Glenn W. Bowen

[57] ABSTRACT

An I-Q channel adaptive line enhancer has bandpass filters with passbands that can be widened to well beyond the band that is actually being processed by the adaptive line enhancer. This eliminates the requirement of filtering one of the sidebands as is required in single channel adaptive line enhancers, in which the sum and difference sidebands are generated on up-conversion. Band limiting is done with lowpass filters, and the local oscillator may be made variable so that any part of the band that is passed by the bandpass filters can be processed by a single I-Q channel adaptive line enhancer. This type of I-Q channel adaptive line enhancer can process any one of a large number of possible bands without tunable bandpass filters, or without banks of adaptive line enhancers which have been preset to adjacent sub-bands.

8 Claims, 1 Drawing Sheet

I-Q CHANNEL ADAPTIVE LINE ENHANCER

BACKGROUND OF THE INVENTION

Prior single channel adaptive line enhancers that employ up/down conversion require that unrealistic constraints be imposed on the internal bandpass filter in order to achieve satisfactory performance. For instance, in order to avoid excessive folding in at D.C., bandpass filter gain should be down at least 30 dB at the local oscillator frequency. However, filter gain should be near 0 dB throughout the rest of the passband in order to achieve reasonable narrowband rejection figures.

This is true because in order to achieve the best performance from the adaptive line enhancer, the weight accumulators of the line enhancer should utilize the full dynamic range available to them. But attenuation in the narrowband channel causes the values in the weight accumulators to increase in order to compensate for this attenuation, which eventually results in railing of the weight accumulators with a consequent degradation of filter performance. If a passband of 50 MHz which is centered at 1.7 GHz is required and both of the above constraints are imposed, bandpass filters become impractical. In order to compensate, two stage down conversion may be attempted, but the resulting greater complexity, larger hardware requirements and an increased residual error because of phase noise make this approach undesirable.

Adaptive line enhancers (ALE) employ feedback to enhance the narrowband frequency spectrum that is present in a broadband noise field or to suppress narrowband interference in a broadband signal. Adaptive line enhancers are constructed so that they automatically adjust to variations in the input signal in order to provide a least mean square (LMS) approximation of a Wiener-Hopf filter. This device uses a number of stored weight values which are continuously adjusted so that the device automatically filters out the components of the signal which are not correlated in time, and passes correlated stable spectral lines. This enhanced narrowband signal is subtracted from the composite input signal to generate the error or feedback signal.

The McCool et al U.S. Pat. No. 4,238,746 issued Dec. 9, 1980 entitled "Adaptive Line Enhancer," the McCool et al U.S. Pat. No. 4,243,935 issued Jan. 6, 1981 entitled "Adaptive Detector" and the article entitled "The Time-Sequenced Adaptive Filter" by Ferrara, Jr. and Widrow which was published 1981 in the IEEE Transactions on Circuits and Systems, Vol. CAS-28 (1981) June N 6, New York USA show prior art devices and/or provide discussions of the theoretical basis of the adaptive line enhancer.

BRIEF DESCRIPTION OF THE DRAWINGS

The present invention is disclosed by reference to the drawings in which.

TECHNICAL DESCRIPTION OF THE INVENTION

Figure 1:
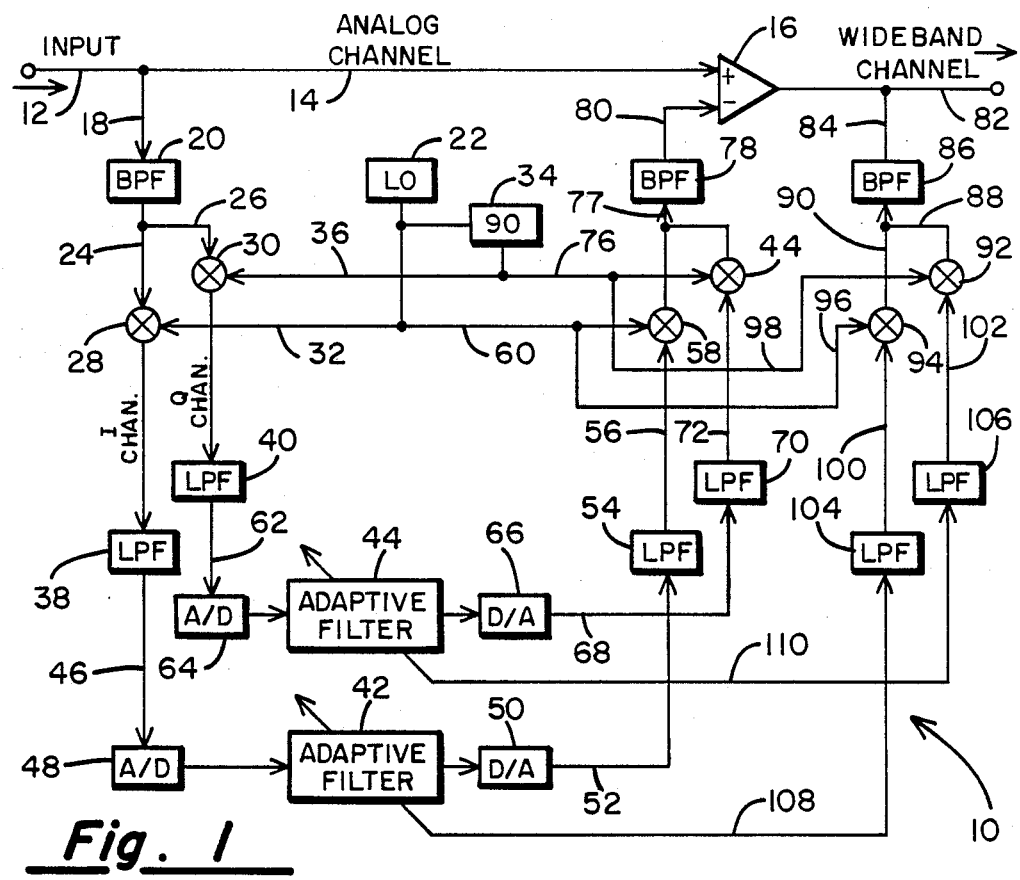
FIG. 1 which shows a block diagram of an embodiment of the present invention.

The adaptive line enhancer 10 of FIG. 1 receives an analog signal on the input line 12. This signal is transmitted on the ANALOG CHANNEL (line 14) to the noninverting input (labeled "+") of analog summer 16. A portion of the signal is coupled onto line 18 and is passed through the bandpass filter 20. A fixed local oscillator 22 is also employed. The pass-band of the bandpass filter 20 is desirably flat over a specified frequency range, and the local oscillator frequency is set at the center frequency of the pass-band. The output of the bandpass filter is transmitted on lines 24 and 26 to the signal mixers, or multipliers, 28 and 30 respectively. Mixer 28 is used to supply the I channel reference signal and mixer 30 is used to supply the Q channel reference signal.

The output of local oscillator 22 is transmitted on line 32 to multiplier 28, and the local oscillator output is passed through a 90° phase shifter 34 and is transmitted on line 36 to mixer 30. The bandpass filtered signal is thus split into the two channels and is quadrature mixed to baseband. The I and Q channel signals are then lowpass filtered with filters 38 and 40 respectively. Lowpass filters 38 and 40 are identical and are preferably designed to have a passband from D.C. to a frequency which is well below the frequency of the local oscillator. Use of the lowpass filters 38 and 40 relaxes the constraints that must be placed on the bandpass filter 20. The filters 38 and 40 restrict the bandwidth of the I and Q channel reference signals to the Nyquist rate of the digital adaptive filters 42 and 44. The adaptive filters 42 and 44 may be constructed in accordance with known techniques.

Referring to FIG. 1, the adaptive filter 42 receives a signal from the lowpass filter 38 on line 46 via the analog-to-digital A/D converter 48. The output of the adaptive filter 42 is supplied to the digital-to-analog D/A converter 50 which supplies its analog output signal on line 52 to the lowpass filter 54. The lowpass filter 54 is used to eliminate the high frequency D/A transition components. The output of this lowpass filter 54 is transmitted on line 56 to signal mixer 58, which also receives the local oscillator signal on line 60. In a similar manner, the output from the lowpass filter 40 is passed on the line 62 to the A/D converter 64 which is coupled to the adaptive filter 44. The output of the adaptive filter 44 is supplied to D/A converter 66 which provides its narrowband output signal on line 68 to lowpass filter 70. The output of lowpass filter 70 is transmitted on line 72 to multiplier 74, which also receives the 90° phase-shifted signal from the delay circuit 34 on line 76. Thus, the I and Q channel signals are quadrature mixed, summed on line 77 and are supplied to bandpass filter 78. The output of bandpass filter 78 is transmitted on line 80 to the inverting input terminal (labelled "−") of the analog summer 16. The signal on line 80 is thus subtracted from the input signal on line 14 resulting in an error signal on the wideband channel line 82.

By setting the LO frequency within the passband of the bandpass filters, folding in at D.C. occurs. However, with the I-Q channel configuration, the unwanted frequencies generated by this folding in at D.C. and the up-conversion process, are exactly cancelled by summing the two narrowband channels. Thus, the constraints on the bandpass filters can be greatly relaxed. In fact, the pass-band of the bandpass filters can be widened to a 300 MHz signal bandwidth if desired. Attenuation in the narrowband and reference channels due to bandpass filter roll off is no longer a significant problem with this system, and the performance of the adaptive line enhancer is improved, particularly at the band edges.

The error signal is coupled onto line 84, and is filtered by bandpass filter 86. The output of bandpass filter 86 is transmitted on line 88 to mixer 92, and on line 90 to mixer 94. The mixer 94 also receives the local oscillator signal on line 96, while mixer 90 receives the 90° phase shifted local oscillator signal on line 98. The error signal is thus quadrature down converted, and the I and Q channel error signals are then transmitted on lines 100 and 102 respectively to the lowpass filters 104 and 106 respectively. These lowpass filters are constructed in the same manner as the lowpass filters 38, 40, and 54, 70. The output of lowpass filter 104 is a weight adjust signal which is sent on the line 108 to the A/D 113 which supplies the weight adjustment signal to the adaptive filter 42, while the output of the lowpass filter 106 is supplied on the line 110 to the A/D 111, which supplies the weight adjustment signal to the adaptive filter 44.

In the present invention the additional hardware required to implement the adaptive line enhancer is justified where doubling of the through-put of the adaptive filter is desirable. In fact, the I-Q configuration of the present invention presents a net savings of hardware over the two contiguous single channel ALE's required to achieve the same through-put. Two stage down conversion is also no longer required, thereby saving six bandpass filters and two local oscillators. In addition, only three bandpass filters are needed for the I-Q configuration, which saves three additional bandpass filters.

As previously mentioned, the passband of the bandpass filters that are used can be widened to include an entire 300 MHz signal bandwidth if desired. This flexibility gives the I-Q channel ALE of the present invention a significant advantage over the single channel configuration. Since the lowpass filters restrict the I and Q channel reference signal bandwidths to the Nyquist rates of the adaptive filters, the local oscillator frequency can be varied, resulting in the selective processing of a wide portion of the signal band which is passed by the bandpass filters. This means that the filter can be tuned to any part of the signal band where narrowband interference is a problem, or where spectral line enhancing is desired. The I-Q ALE of FIG. 1 has twice the throughput of a single channel ALE.

It might be anticipated that a problem might arise due to the requirement that the two adaptive filters 42 and 44 must be balanced in order to precisely cancel the unwanted frequencies generated by fold-over and up-conversion. Also, since the two processors are "tied together", the adjustment of the weights of one processor might be expected to cause the other processor to adapt and thereby present stability problems. However, these concerns may be eliminated and the design of the I-Q ALE may be simplified by observing that the optimal weights for both of the adaptive processors are exactly the same.

This can be understood by observing that both adaptive filters 42, 44 must form bandpass filters centered about the same narrowband interference frequencies. In addition, assuming that the I and Q reference channels are balanced, and the narrowband channels are balanced, they should both have the same time delay as well. Thus, the magnitude and phase characteristics of each adaptive filter are the same, from which it follows that the optimal weights for each filter must be identical.

Figure 2:
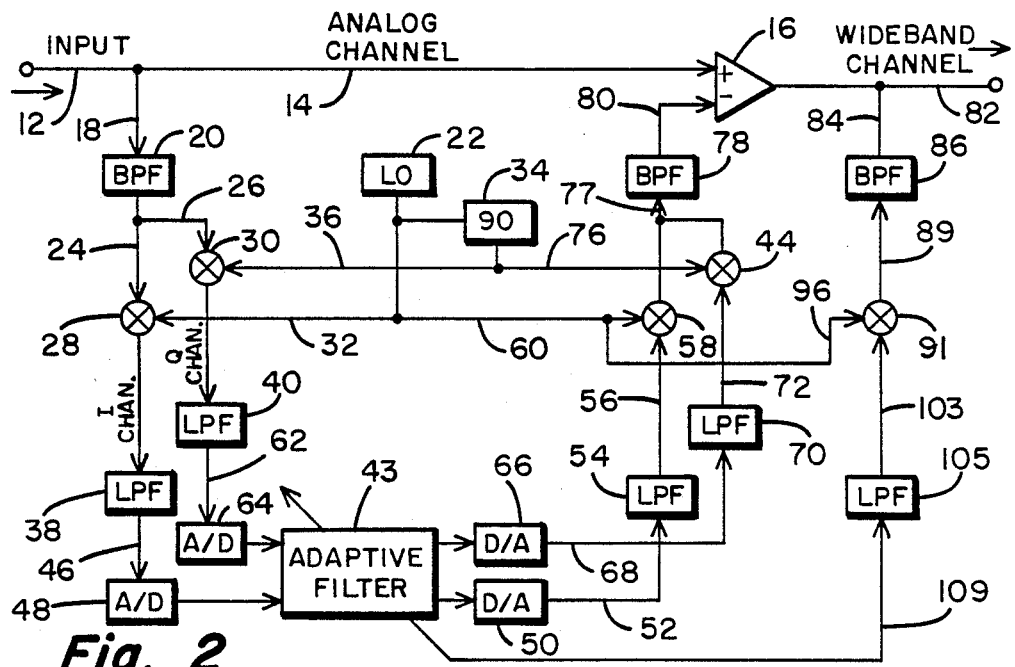
FIG. 2 shows the block diagram of an alternate embodiment of the present invention.

The embodiment of FIG. 2, which is a simplification of the embodiment of FIG. 1, utilizes a dual adaptive filter with a common set of weight accumulators and one set of update circuits. Thus, the single set of weight accumulators is used to form the narrowband output for both of the channels. In addition, one error feedback channel is eliminated. Thus, the adaptive filter 43 utilizes two input lines, and two tapped delay lines, one for each of the I and Q reference channels, and two separate multiply and summation circuits, but only one set of weight accumulators. Elements that are identical to those of FIG. 1 are labelled with the same numbers in FIG. 2. The local oscillator 22 may be made variable and by widening the passbands of the bandpass filters a number of possible bands may be processed by the ALE of the present invention. This is possible because bandlimiting is accomplished in the present invention with the bandpass filters. Thus, any band that is passed may be processed by a single I-Q channel ALE.

The error signal is coupled onto line 84, and is transmitted to band-pass filter 86. The output of bandpass filter 86 is then transmitted on line 89 to mixer 91, which also receives the local oscillator signal on the line 96. The weights of an adaptive filter are generated by repeatedly summing the product of the error signal with taps into the weight accumulators. For example, the $i^{th}$ weight $W_i$ is updated by summing: $W_i + \mu \epsilon X_i$. Here $\mu$ is the scale factor, $\epsilon$ is the error signal, and $X_i$ is the $i^{th}$ tap value. Now updating the weights with the I-channel taps values requires the I-channel error. Updating the weights with the Q-channel taps values requires the Q channel error feedback.

The output of the mixer 91 is then supplied on the line 103 to lowpass filter 105, which has the same characteristics as previously mentioned for the lowpass filters 104 and 106. The output of the lowpass filter 105 is supplied on the line 109 to the A/D 115 which supplies the weight update control signal to the adaptive filter 43, which may be constructed in the same manner as the adaptive filters 42, 44 of FIG. 1.

While particular embodiments of the present invention have been disclosed, other embodiments may be devised within the scope of the invention. Analog time delays in the circuit can be compensated, as shown in copending patent application Ser. No. 030,302, now U.S. Pat. No. 4,726,036 entitled Digital Adaptive Filter for a High Throughput Digital Adaptive Processor, filed Mar. 26, 1987, and assigned to the assignee of the present invention. This copending patent application is hereby incorporated by reference into this application.

We claim:

1. An adaptive line enhancer comprising
input means for supplying an analog input sample signal,
oscillator signal means for supplying a local oscillator signal,
local oscillator delay means for providing a 90° delayed local oscillator signal,
I channel signal means comprising a first signal mixer means for mixing said analog input sample signal and said local oscillator signal and for supplying an I channel analog signal,
first analog-to-digital converter means coupled to receive said I channel analog signal and for providing a first digitized signal representative thereof,
first adaptive filter means coupled to receive said first digitized signal for providing a first adaptive filter output signal, first digital-to-analog converter means coupled to receive said first adaptive filter output signal, narrowband I channel means comprising second mixer means which receives said first adaptive filter output signal and said local oscillator signal for providing a first narrowband output signal, Q channel signal means comprising third mixer means for mixing said analog input signal and said 90° delayed local oscillator signal and for supplying a Q channel analog signal, second analog-to-digital converter means coupled to receive said Q channel analog signal and for providing a second digitized signal representative thereof, second adaptive filter means coupled to receive said second digitized signal for providing a second adaptive filter output signal, second digital-to-analog converter means coupled to receive said second adaptive filter output signal, narrowband Q channel means comprising fourth mixer means which receives said second adaptive filter output signal and said 90° delayed local oscillator signal for providing a second narrowband output signal, signal means coupled to receive said first and second narrowband output signals which is constructed to sum said first and second narrowband output signals, to provide a mixed narrowband output signal and to subtract said mixed narrowband output signal from said analog input sample signal in order to supply a wideband channel output signal, and error means for sampling said wideband output signal to provide a wideband sample signal and for down converting said wideband sample signal to provide an adaptive control weight signal to both of said first and second adaptive filter means.

2. An adaptive line enhancer as claimed in claim 1 wherein said first and second adaptive filter means comprises a common weight accumulator means and said down converting means adjusts said common weight accumulator means.

3. An adaptive line enhancer as claimed in claim 1 comprising I channel error means comprising fifth mixer means coupled to receive said wideband sample signal and said local oscillator signal which is constructed for supplying a fist adaptive weight control signal to update the weights of said first adaptive filter means, and Q channel error means comprising sixth mixer means coupled to receive said wideband sample signal and said 90° degree delayed local oscillator signal which is constructed for supplying a second adaptive weight control signal to update the weights of said second adaptive filter means.

4. An adaptive line enhancer comprising input means for supplying an input sample signal, local oscillator means for providing a local oscillator signal, local oscillator delay means for providing a 90° delayed local oscillator signal, I channel down-conversion means coupled to receive said input sample signal and said local oscillator signal for down-converting said input sample signal and for supplying an I channel signal, Q channel down conversion means 90° coupled to receive said input sample signal and said 90° delayed local oscillator signal for down-converting said input sample signal and for supplying a Q channel signal, adaptive filter means having weight accumulator means that may be updated coupled to receive said I and Q channel signals and for supplying narrowband I and Q output signals, up-conversion means for up-converting said I and Q channel signals and for supplying narrowband I and Q output signals representative thereof, signal means for combining said narrowband I and Q output signals and for subtracting said combined output signal to provide a wideband error signal, and error down-conversion means for down-converting said wideband error signal and for controlling the updating of said weight accumulator means.

5. An adaptive line enhancer as claimed in claim 4 wherein said adaptive filter means comprises a dual adaptive filter with a common set of weight accumulators and said error down-conversion means provides a single weight control signal to said adaptive filter to update said common weight accumulators.

6. An adaptive line enhancer as claimed in claim 5 wherein said adaptive filter means operates a digital input signal and provides analog output signals comprising analog-to-digital converting means for supplying said digital input signals and digital-to-analog converting means for providing said analog output signals.

7. An adaptive line enhancer as claimed in claim 5 wherein said adaptive filter means comprises first and second adaptive filters, each with its own weight accumulator and said error down-conversion means provides first and second weight control signals to respectively update the weight accumulators of weight control signals to respectively update the weight accumulators of said first and second adaptive filters.

8. An adaptive line enhancer as claimed in claim 7 wherein said adaptive filter means operates a digital input signal and provides analog output signals comprising analog-to-digital converting means for supplying said digital input signals and digital-to-analog converting means for providing said analog output signals.

* * * * *

UNITED STATES PATENT AND TRADEMARK OFFICE
CERTIFICATE OF CORRECTION

PATENT NO. : 4,788,652

DATED : November 29, 1988

INVENTOR(S) : Scott R. Bullock, Patrick J. Smith, Laurence D. Sawyer

It is certified that error appears in the above-identified patent and that said Letters Patent are hereby corrected as shown below:

Column 6, lines 46-48, delete "of weight control signals to respectively update the weight accumulators".

Signed and Sealed this

Eighteenth Day of April, 1989

Attest:

DONALD J. QUIGG

Attesting Officer

Commissioner of Patents and Trademarks